US007917820B1

(12) United States Patent
Pavle et al.

(10) Patent No.: US 7,917,820 B1
(45) Date of Patent: Mar. 29, 2011

(54) TESTING AN EMBEDDED CORE

(75) Inventors: Adarsh Pavle, Santa Clara, CA (US);
Shahin Toutounchi, Pleasanton, CA (US)

(73) Assignee: Xilinx, Inc., San Jose, CA (US)

( * ) Notice: Subject to any disclaimer, the term of this patent is extended or adjusted under 35 U.S.C. 154(b) by 386 days.

(21) Appl. No.: 12/123,867

(22) Filed: May 20, 2008

(51) Int. Cl.
*G01R 31/28* (2006.01)

(52) U.S. Cl. .................. 714/727; 714/718; 714/728

(58) Field of Classification Search .............. 702/119; 714/724, 718, 719, 727, 731, 728
See application file for complete search history.

(56) References Cited

U.S. PATENT DOCUMENTS

| 6,408,412 B1 * | 6/2002 | Rajsuman ................ 714/724 |
| 7,218,137 B2 | 5/2007 | Vadi et al. |
| 7,313,739 B2 * | 12/2007 | Menon et al. ............... 714/718 |
| 7,529,996 B2 * | 5/2009 | Whetsel ....................... 714/731 |
| 2003/0167144 A1 * | 9/2003 | Wang et al. ................. 702/119 |
| 2009/0183040 A1 * | 7/2009 | Whetsel ....................... 714/727 |

OTHER PUBLICATIONS

Jaramillo, Ken et al., "10 tips for successful scan design: part one," EDN—Electronics Design, Strategy, News, Feb. 17, 2000, pp. 67-75, available at www.ednmag.com.
Xilinx, Inc., "Dynamic Reconfiguration Port (DRP)," Virtex-5 FPGA Configuration User Guide, Apr. 14, 2006, UG191 (v.1.0), Chapter 18, pp. 579-582, available from Xilinx, Inc., 2100 Logic Drive, San Jose, CA 95124, USA.

* cited by examiner

*Primary Examiner* — David Ton
(74) *Attorney, Agent, or Firm* — W. Eric Webostad; Thomas George

(57) ABSTRACT

A method of testing of an embedded core of an integrated circuit ("IC") is described. An IC has a hardwired embedded core and memory coupled to each other in the IC. The method includes writing a test vector to the memory while the embedded core is operative. The test vector is input from the memory to the embedded core to mimic scan chain input to the embedded core. A test result is obtained from the embedded core responsive in part to the test vector input.

19 Claims, 7 Drawing Sheets

TESTING AN EMBEDDED CORE

FIELD OF THE INVENTION

The invention relates to integrated circuit devices (ICs). More particularly, the invention relates to testing an embedded core of an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

An FPGA may include one or more cores, such as in a multi-core device or a System-on-Chip ("SoC"). These one or more cores may be embedded cores that are hardwired. However, one or more hardwired embedded cores ("embedded core") in an FPGA may pose a problem for testing. For example, an embedded core manufactured as part of an FPGA may have some or all of its interface pins, which would be accessible if such core were manufactured as a standalone device, generally not readily accessible other than via circuitry of the FPGA.

Thus, in some instances a scan chain, formed as a series of flip-flops, may not be present as being coupled to an interface portion of an embedded core for directly testing circuitry of such embedded core associated with such interface portion. In other words, such scan chain overhead may not be included as part of the integrated circuit, or, in the example of PLDs, may not be capable of being instantiated for being directly coupled to such interface portion. Unfortunately, software test benches used to generate test patterns for testing ICs operate under the assumption of a scan chain input for providing test vectors to test circuits.

Accordingly, it would be desirable and useful to provide means to test circuitry directly associated with an interface portion of an embedded core in instances when a scan chain is not capable of being directly coupled to such interface portions.

SUMMARY OF THE INVENTION

One or more aspects generally relate to testing an embedded core of an integrated circuit ("IC").

An aspect relates generally to a method for testing an IC having a hardwired embedded core and memory. The memory is coupled to the embedded core in the IC. The method includes writing a test vector to the memory while the embedded core is operative. The test vector is input from the memory to the embedded core to mimic scan chain input to the embedded core. A test result is obtained from the embedded core responsive in part to the test vector input.

Another aspect relates generally to a system for testing an embedded core coupled to an array of memory cells within a host IC. The system includes a programmed computer which is programmed with a testing software program. A device under test is coupled to the programmed computer for receiving test vectors therefrom and for providing test results thereto responsive to the test vectors. The device under test includes a write controller for respectively receiving portions of the test vectors and configured to convert each portion of the portions from serial to parallel to output data. The write controller is configured to generate control information and address information. A memory controller is coupled to the write controller for receiving the address information, the control information, and the data therefrom. The array of memory cells is coupled to the memory controller, the memory controller for selectively writing the data to locations in the array of memory cells. The embedded core is coupled to the array of memory cells, wherein operation of the embedded core is dynamically alterable responsive to the data input from the array of memory cells. The write controller, the memory controller, and the array of memory cells are configured to mimic scan chain input with respect to the testing software for testing the embedded core.

Yet another aspect relates generally to a host IC having an embedded core and memory. The host IC has a write controller for respectively receiving portions of test vectors. A memory controller is coupled to the write controller for receiving address information, control information, and data from the write controller. The memory is coupled to the memory controller for selectively writing the data thereto. The embedded core is coupled to the memory, wherein operation of the embedded core and the memory is configured for dynamically writing to the memory while operating the embedded core. The write controller, the memory controller, and the memory are configured to mimic scan chain input with respect to a testing software program for testing the embedded core.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
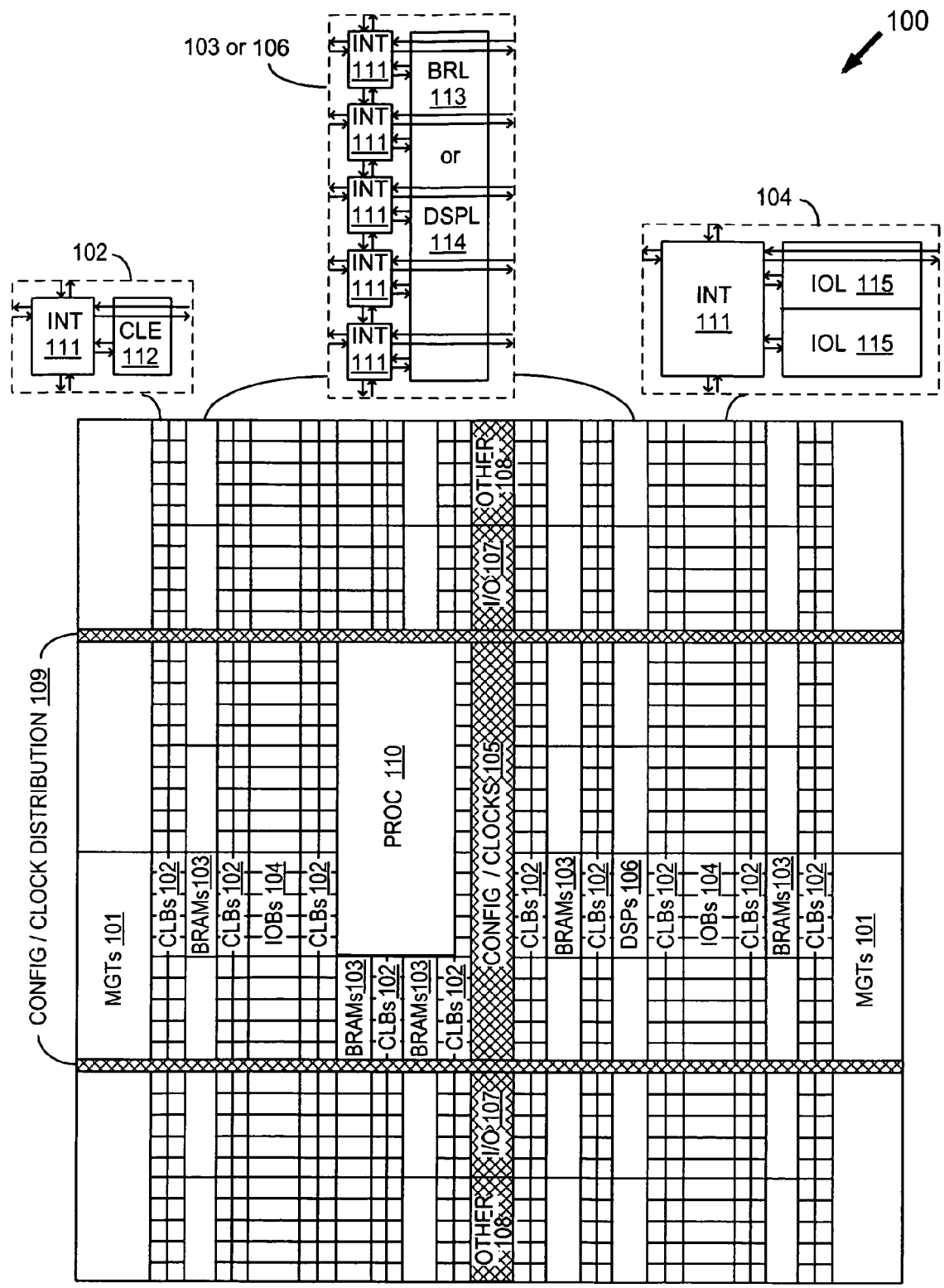
FIG. 1 is a simplified block diagram depicting an exemplary embodiment of a columnar Field Programmable Gate Array ("FPGA") architecture in which one or more aspects of the invention may be implemented.

FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Automatic Test Pattern Generation and Automatic Test Pattern Generator are referred to by the acronym "ATPG." ATPG is used to generate a test pattern input sequence for testing a circuit. Such generated patterns may be used to test semiconductor devices after manufacture ("ATPG testing"). The effectiveness of ATPG testing may be measured by one or more data points, including test coverage, pattern count, and runtime, among others.

By applying a test pattern to a manufactured design, a fault may be detected when one or more observed logic values differ from expected values. An ATPG testing process for a targeted fault generally includes two phases, namely, a fault activation phase and fault propagation phase. The fault activation phase is used to provide a test input to a fault model to produce a result output from the fault model. The fault propagation phase is for moving the result output forward via a path from the fault model to at least one output interface pin.

Two types of fault models are: a Stuck-At Fault model and Transition Fault model. Other types of fault models may be for bridging faults, open faults, and transient environmental faults, among others. While ATPG testing may have a substantially complete set of search strategies and heuristics for testing, for purposes of clarity by way of example and not limitation, the two fault models, namely the Stuck-At Fault model and the Transition Fault model, are considered.

A Stuck-At Fault model assumes that one of the signal lines in a circuit is stuck at a fixed logic value. There may be n signal line inputs, for n an integer greater than 1, to a circuit, of which one such signal line input is assumed to be stuck at a fixed logic value. Thus, there are potentially $2n$ "stuck-at" faults for a circuit. A Stuck-At Fault model is based on logic only, as no timing information, such as regarding delay, is associated with fault definitions used in such model.

A Transition Fault model is used to determine whether events occur within time windows associated therewith. Thus, a Transition Fault model is used to detect transition faults, namely faults associated with delay.

For both of the Stuck-At Fault and Transition Fault models, three factors are considered: test coverage, pattern count, and run-time. Thus, for example, in ATPG testing, searches for a sequence of vectors are used to check for a particular fault through the set of possible vector sequences. The set of vector sequences, which may be a subset of all possible vector sequences, is thus used to obtain sufficient coverage within some useful run-time. It may be possible to use all possible vector sequences; however, the run-time for such testing may be unreasonable. Furthermore, it should be understood that it may not be possible to test 100% of the circuitry of a device with ATPG testing, even if all possible vector sequences are used. Thus, it should be understood that trade-offs exist among these three factors of test coverage, pattern count, and runtime.

In the following description, it shall be apparent that test coverage may be enhanced with a fewer number of patterns and thus with lower ATPG testing run time. An embedded core may have a significant number of configuration pins that are accessible only via configuration memory cells of an FPGA, such as FPGA 100. Heretofore, these configuration pins could not be fully controlled for purposes of ATPG testing of such embedded core, and thus such configuration pins were significantly constrained during ATPG testing to match configuration of circuitry of such embedded core under test. However, by use of dynamically reconfiguring configuration memory cells while an embedded core is under test, configuration memory is controlled by write circuitry for an ATPG software tool or other software testing tool ("test bench") for controlling input to configuration pins for such an embedded core.

In the following description, it shall be described how configuration memory is modeled as a scan chain for a test bench, where such modeling allows each scan cell of such hypothetical scan chain to correspond to one configuration memory cell of the configuration memory. Information may be provided from such a test bench for dynamically reconfiguring configuration memory cells for each pattern without having to go through sequential memory writes under software control. The following description is in terms of an FPGA having a dynamic reconfiguration port ("DRP"); however, it should be appreciated that any integrated device having the capability to dynamically reconfigure memory coupled to an embedded core along the lines described herein may be used.

For pattern implementation, namely when FPGA 100 is configured for scan testing, write controller circuitry is instantiated in FPGA fabric. Such write controller circuitry interfaces with a DRP of FPGA 100 to load configuration scan chain data into configuration memory during scan load cycles. It should be appreciated that the computationally intensive sequential memory writes are offloaded from the test bench to write controller circuitry, which write controller circuitry may be specifically designed for this test purpose as instantiated in FPGA fabric. By FPGA fabric, it is generally meant programmable logic and programmable interconnects. FPGA fabric may include an array of CLBs, adaptive logic modules ("ALMs"), or other user programmable logic function blocks.

Rather than attempting to design ATPG memory models for a test bench and associated custom write circuitry for ATPG processing, write controller circuitry instantiated in FPGA fabric avoids such complexity while enhancing test coverage in less run time. Even though write controller circuitry as described herein is instantiated in FPGA fabric, it should be appreciated that write controller circuitry need not be entirely implemented in FPGA fabric, but may be a combination of hardwired circuitry and programmable circuitry of FPGA fabric, or may be hardwired circuitry such as built-in self-test ("BIST") circuitry. However, for the example described herein for purposes of clarity and not limitation, it shall be assumed that the write controller circuitry is entirely implemented in FPGA fabric.

Thus, even though the following description is with respect to an FPGA, it should be understood that such description is equally applicable to other integrated circuits with dynamically reconfigurable memory coupled to an embedded core.

Figure 2:
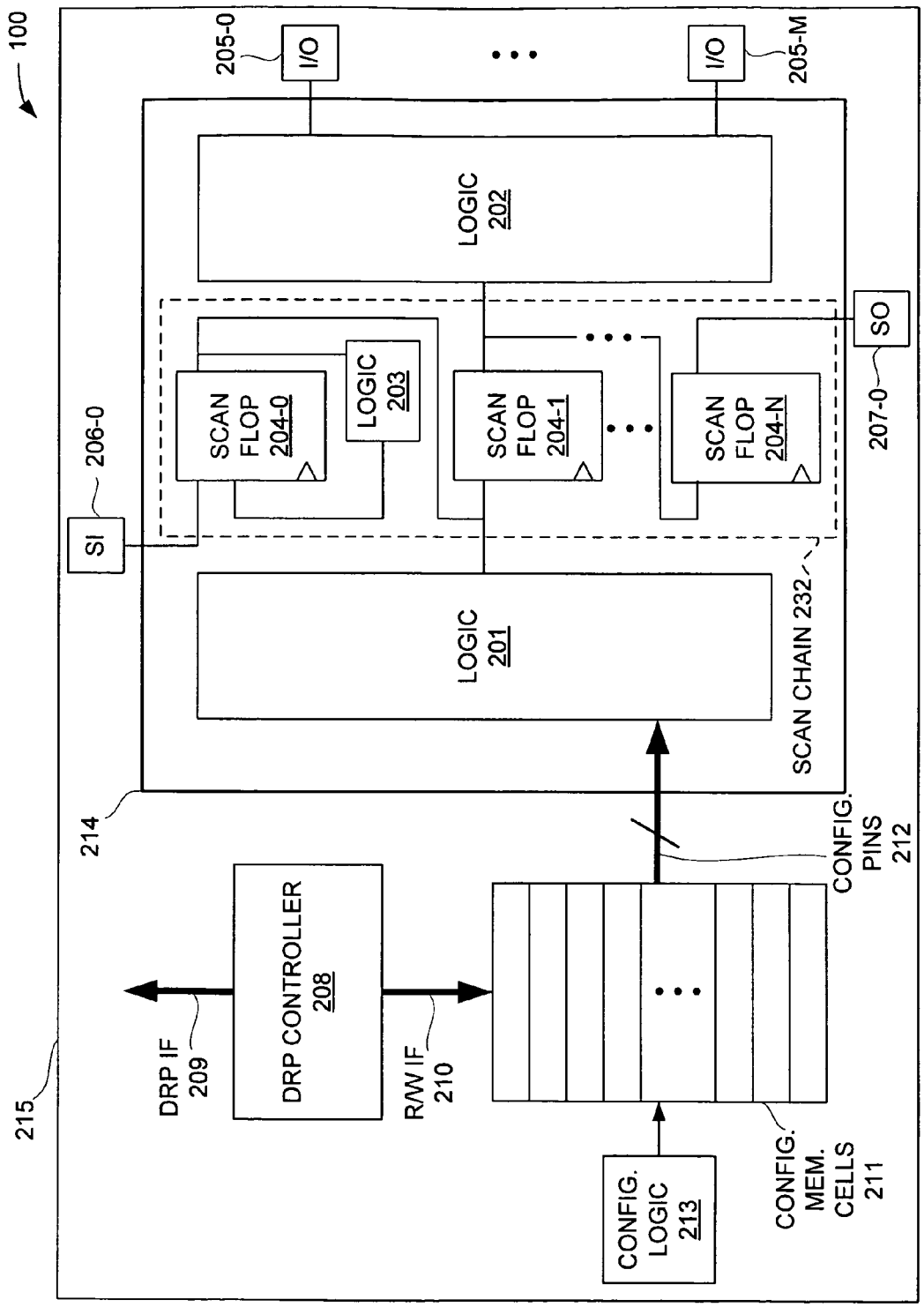
FIG. 2 is a block/circuit diagram depicting an exemplary embodiment of an FPGA having a system block.

With reference to FIG. 2, there is shown a block/circuit diagram depicting an exemplary embodiment of an FPGA 100 having a system block 215. System block 215 includes embedded core 214, configuration memory cells 211, configuration logic 213, and DRP controller 208. Configuration logic 213 is conventionally used to configure configuration memory cells 211. An unconventional way to configure configuration memory cells is dynamically, as described below in additional detail.

Within embedded core 214 there is logic block 201 which is coupled to configuration memory cells 211 via a configuration memory interface, namely configuration pins 212. For FPGA 100 of FIG. 1 being a Virtex 5™ available from Xilinx, Inc., configuration pins may include pins 0 to 1,279, namely 1,280 configuration pins. However, other numbers of configuration pins may be used. Thus, configuration memory cells 211 may be used to provide input to logic block 201 via configuration pins 212. For this example, a test vector is broken up into 80 16-bit portions, and thus there are 1280 (i.e., 80 multiplied by 16) configuration pins 212 used for loading a test vector into embedded core 214. Accordingly, there may be 1280 configuration memory cells 211 used corresponding to the 1280 configuration pins, namely one scan memory configuration cell per configuration pin.

An output side of logic block 201 may optionally be coupled to a scan chain 232 hardwired within embedded core 214. Scan chain 232 is formed via a series of flip-flops 204-0 through 204-N, for N a positive integer greater than one. Flip-flops 204-0 through 204-N are collectively referred to hereafter as scan registers 204. Scan chain 232 may be BIST circuitry.

Via scan registers 204, a test bench may control and observe internal logic 203 of embedded core 214. Internal logic 203 of embedded core 214 is hardwired, and its operation is observable responsive test vectors provided to scan chain 203. Test vectors may be input to scan chain 232 via scan input port ("SI") 206-0. Response to such test vector input by internal logic 203 may be observed at scan output port ("SO") 207-0.

Furthermore, scan chain 232 may be used to register output from internal logic 203 as input to logic block 202. Input/output ports ("I/Os") 205-0 through 205-M, for M a positive integer greater than zero, may be coupled to logic block 202 of embedded core 214. I/Os 205-0 through 205-M are hereafter collectively referred to as I/Os 205. Optionally, by providing test input via SI 206-0 and obtaining output responsive to such input via I/Os 205, I/Os 205, accessible via FPGA fabric, may be used to observe response of internal logic block 202, as well as internal logic block 203, to such test input.

Accordingly, it should be appreciated that a test bench is not restricted in terms of controlling and observing scan registers 204 of scan chain 232 and I/Os 205 for testing of hardwired logic blocks 202 and 203 of embedded core 214.

However, logic block 201, which is also a hardwired logic block of embedded core 214, interfaces with configuration memory cells, and is not directly controllable by such test bench.

Embedded core 214 is dynamically reconfigurable. In this exemplary embodiment, embedded core 214 may be reconfigured through DRP interface ("IF") 209 while FPGA 100, and more particularly system block 215, is in operational use. DRP interface 209 may be accessible through FPGA fabric. DRP interface 209 and DRP controller 208 coupled thereto are known with reference to Xilinx FPGAs, and thus are not described in unnecessary detail.

DRP controller 208 may be used to selectively address configuration memory cells 211 via read/write interface ("R/W IF") 210. As described below in additional detail, configuration data is written to configuration memory cells 211 during one scan load and then overwritten during a subsequent scan load, and this writing may be done dynamically while operating system block 215. By dynamically writing and subsequently overwriting configuration data, configuration memory cells 211 may mimic a scan chain as described below in additional detail.

For a dynamically reconfigurable input to embedded core 214, an ATPG memory model corresponding to configuration memory 211 for a test bench may be created such that the test bench controls configuration pins 212. Alternatively, write control circuitry may be instantiated in FPGA fabric, as described below in additional detail. It should be appreciated that ATPG software tools are generally inefficient handling memories due to the sequential nature of memories. Accordingly, it is believed that having either a BIST write controller for configuration memory cells 211 or an instantiated-in write controller for configuration memory cells 211 is substantially more efficient than using a test bench to control configuration pins 212.

Figure 3:
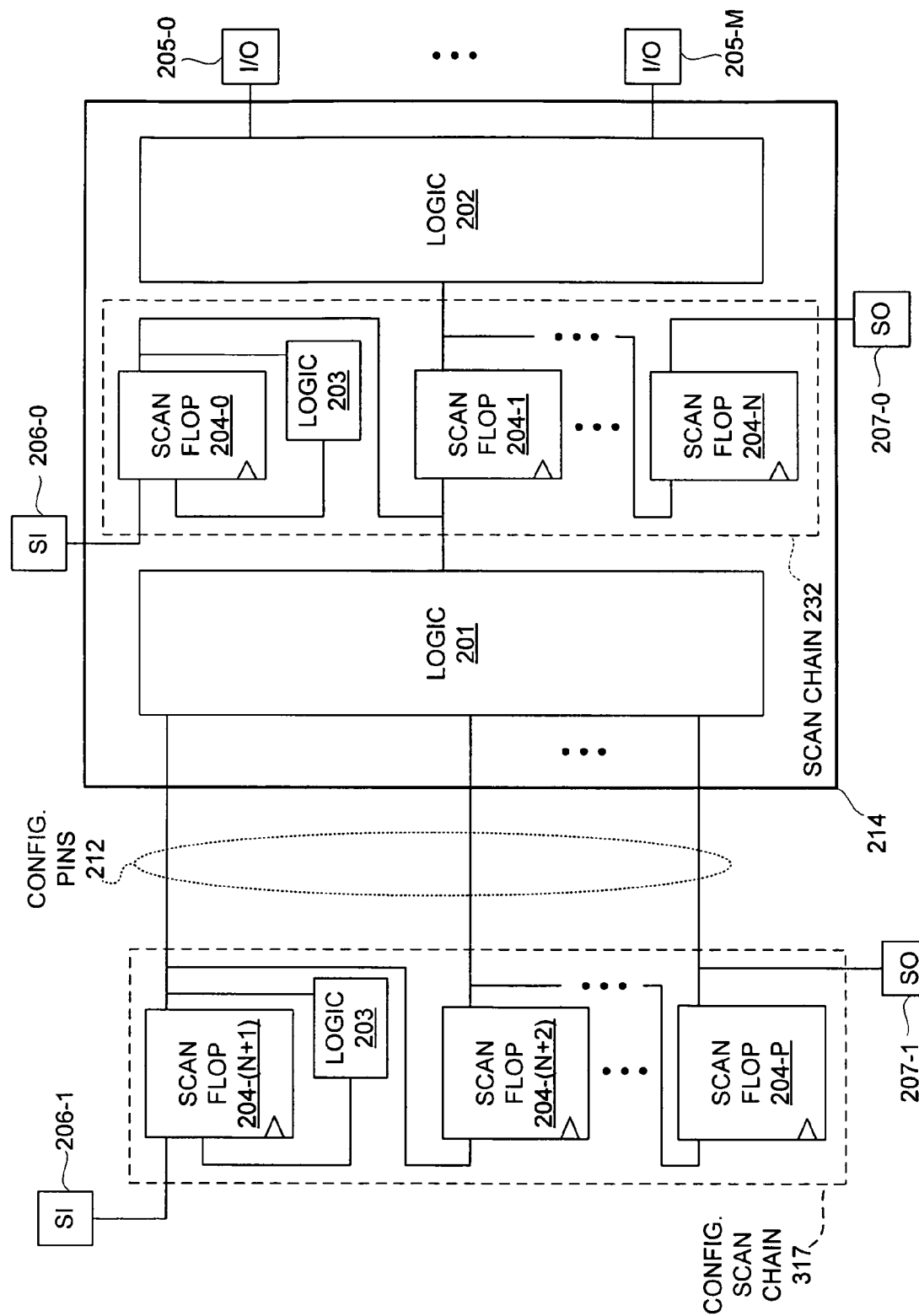
FIG. 3 is a block/circuit diagram depicting an exemplary embodiment of a configuration scan chain model coupled to configuration pins of an embedded core of the system block of FIG. 2.

Referring to FIG. 3, there is shown a block/circuit diagram depicting an exemplary embodiment of a configuration scan chain model coupled to configuration pins 212 of embedded core 214. Configuration scan chain 317 is illustratively shown as a chain of scan flip-flops 204-(N+1) through 204-P, for P a positive integer greater than N+1. Configuration scan chain 317 has an SI port 206-1 and an SO port 207-1. Outputs of scan flip-flops 204-(N+1) through 204-P of configuration scan chain 317 may correspond to configuration pins 212.

It should be understood that configuration scan chain 317 does not physically exist within system block 215. Having such a scan chain 317 directly coupled to configuration pins 212 would involve a significant amount of additional hardware overhead. Rather, configuration scan chain 317 is a scan chain model of configuration memory 211 for ATPG purposes. Thus, a test bench may perform a scan load, which scan load in the view of such test bench appears as providing test vector input to SI port 206-1 for configuration scan chain 317. In other words, such test bench does not see what would otherwise be computationally intensive sequential write operations associated with an ATPG memory model. Thus, each scan cell or register 204-(N+1) through 204-P in configuration scan chain 317 may correspond to a configuration memory cell in configuration memory 211 of FIG. 2. This modeling of a configuration scan chain 317, along with DRP capability, allows a test bench to reconfigure embedded core 214 for each test pattern by shifting it in as configuration data into configuration memory 211 without having to address sequential writes for configuration memory 211.

Figure 4:
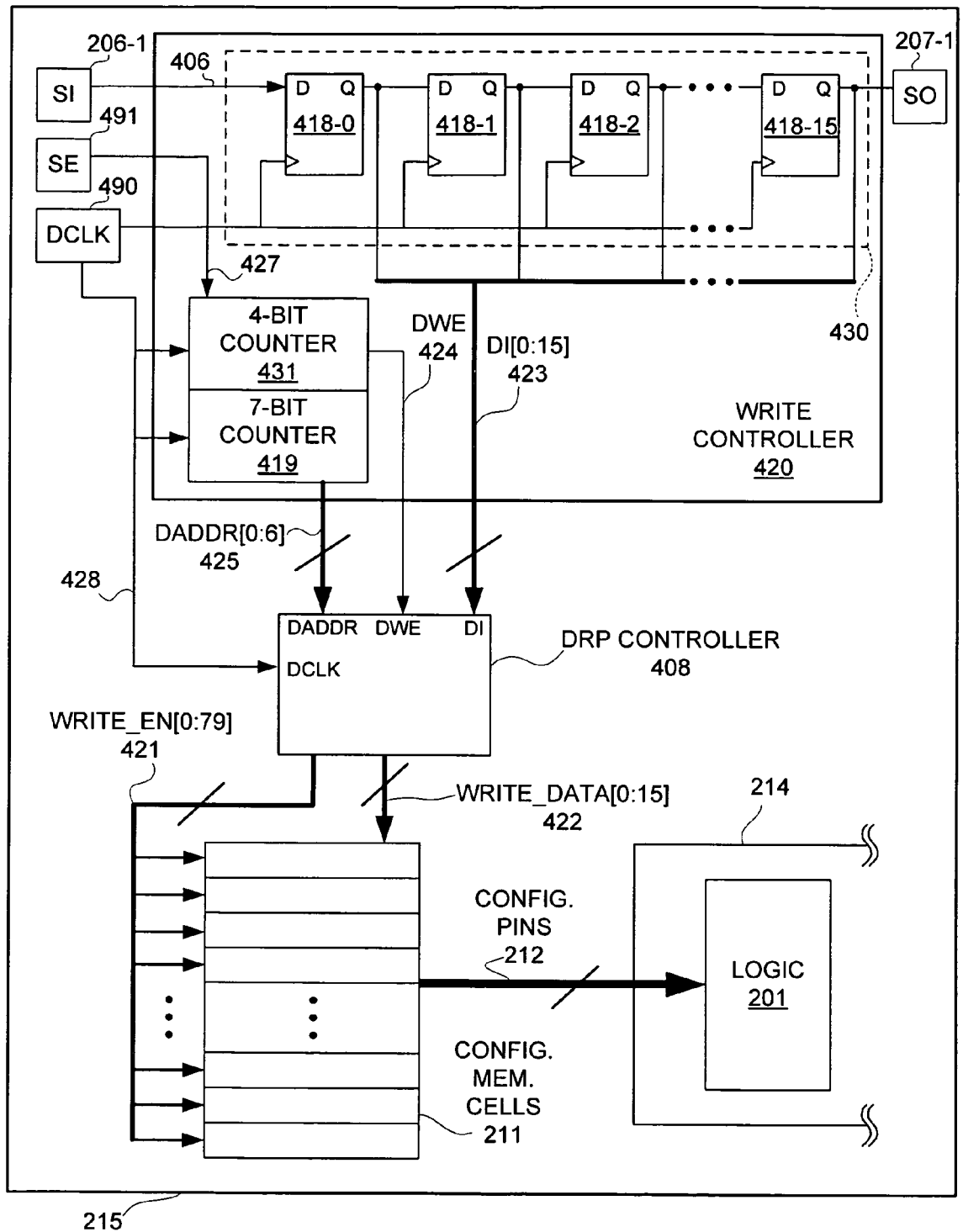
FIG. 4 is a block/circuit diagram depicting an exemplary embodiment of a write controller instantiated in FPGA fabric to form part of the system block of FIG. 2.

FIG. 4 is a block/circuit diagram depicting an exemplary embodiment of write controller 420 instantiated-in FPGA fabric to form part of system block 215 of FIG. 2. Write controller circuitry 420 is instantiated in FPGA fabric of FPGA 100. Write controller circuitry 420 is coupled to SI 206-1 for providing configuration scan chain data to configuration memory cells 211 via write controller 420 during a scan load. Furthermore, write controller 420 may optionally be coupled to SO 207-1 for unloads of configuration scan chain data, such as to verify correct operation of shift register 430 of write controller 420.

Write controller 420 may be used to perform computationally intensive sequential memory write operations in a substantially more efficient manner than ATPG software tools. In the following exemplary embodiment, circuitry is described with reference to an interface to a DRP as part of a Xilinx FPGA. However, it should be appreciated that the following description applies equally to configuration of an embedded core 214 coupled to dynamically writable memory cells 211, where a memory controller other than a DRP controller is used.

A DRP interface, such as DRP interface 209 of FIG. 2, includes a data clock port 490 for providing a data clock signal 428, an address bus ("DADDR") 425, a data input bus ("DI") 423, and a write enable port/signal ("DWE") 424. As used herein a bus may be a set of lines or signals, or both. Configuration memory cells 211 may be row addressable. For this example, a word width of 16 bits is used as indicated by DRP controller 408 being coupled to configuration memory cells 211 via write data bus 422 having bits [0:15]. However, it should be appreciated that other word widths may be used.

Address bus 425 may be used to address a row of configuration memory cells 211. In this example, address bus 425 is indicated as a 7-bit wide data address bus; however, other address widths may be used. Data input bus 423 provides data via DRP controller 408 to write data bus 422 for writing to configuration memory cells 211. For this example, data input bus 423 is 16 bits wide; however, other bit widths may be used. Input data is written to a selected row as indicated by an address on address bus 425. In this example, there are 80 rows of configuration memory cells as indicated by a write enable bus 421 for rows [0:79] coupling DRP controller 428 to respective rows of configuration memory cells 211. However, other numbers of rows of configuration memory cells may be used. Even though in this example only 80 rows of valid memory addresses of configuration memory cells 211 are used, it should be understood that a DRP interface available in Xilinx, Inc., FPGAs allows addressing 128 locations. Thus, it should be appreciated that other implementations may use more of this address space than is illustratively shown with reference to FIG. 4.

In this example, data is written to configuration memory cells 211 on a positive or rising edge of data clock signal 428; however, it should be appreciated that data may be written on a negative edge of a clock signal or on both edges of a clock signal. Data is written on the selected row on such positive edge of data clock signal 428 when data write enable signal 424 is at a logic high level.

Write enable bus 421 may be a "one-hot" bus, meaning that only one row of configuration memory cells is active for writing data thereto at a time. DRP controller 408 may be configured to decode address information provided via data address bus 425 to indicate which row is the "hot" row. Address information on write enable bus 421 provided to configuration memory cells 211 may thus be a decoded version of address information provided via data address bus 425 to DRP controller 408 for selecting one of 80 memory locations or rows of configuration memory cells 211. Even though writing to rows of configuration memory cells is described, it should be appreciated that other orientations for writing to configuration memory cells 211 may be used, such as by columns.

Write data on write data bus 422 is a buffered version of input data on data input bus 423, where DRP controller 408 may provide such buffering. Again, input data provided by data input bus 423, after buffering, may be written to a selected memory address of configuration memory cells 211.

Write controller 420 drives signals associated with DRP interface 209 of FIG. 2, namely a data address signal on data address bus 425, a data write enable signal 424, and any input data on data input bus 423 (collectively, "DRP interface signals"). Data clock signal 428 is also part of DRP interface signals, but is not driven by write controller 420. To drive such DRP interface signals, write controller 420 registers serial configuration scan data obtained, such as from a database associated with a test bench, via SI 206-1 as configuration scan data 406. A shift register 430 formed by a series of registers 418-0 through 418-15 serially receives such configuration scan data 406, and such configuration scan data 406 is serially shifted responsive to data clock signal 428 into such shift register 430.

Output ports of registers 418-0 through 418-15, which may be implemented using flip-flops, collectively provide data input bus 423. Thus, shift register 430 is a 16-bit serial-to-parallel shift register. The 16-bit output of shift register 430 drives input data on data bus 423 to a data input port of DRP controller 408.

For each 16 bits of data loaded into shift register 430, a 4-bit counter 431, which is clocked responsive to data clock signal 428, asserts data write enable 424. For each 16 bits of data loaded into shift register 430, a 7-bit address counter 419, which is clocked responsive to data clock signal 428, may increment a count to provide as an output via data address bus 425. In other words, addresses provided to a data address port of DRP controller 408 are provided by 7-bit counter 419. Counter 419 incrementally increments each count or address for a next row after each 16 bits of data are loaded into shift register 430. During scan load/unload operations for every 16 clock cycles of data clock signal 428, a configuration memory write operation is performed, and this may be performed until all targeted rows of configuration memory cells 211 are written with test information, such as ATPG input.

A scan enable port ("SE") 491 is used to provide a scan enable signal 427 to 4-bit counter 431. Scan enable signal 427 may be held high during shift operations of shift register 430 and may be held low during operations where data from configuration memory cells 211 has been captured for providing to configuration pins 212 for logic 201 of embedded core 214. Only a portion of embedded core 214 is illustratively shown in FIG. 4 for purposes of clarity; however, it should be appreciated that embedded core 214 of FIG. 4 may be embedded core 214 of FIG. 1.

Even though counters 431 and 419 are shown as separately clocked blocks, it should be appreciated that a single block of logic may be used for providing the separate counting operations, and thus scan enable signal 427 may be used as an enable signal for both counters 431 and 419. Furthermore, even though specific values of 4 and 7 bits have been used to described counters 431 and 419, respectively, it should be appreciated that other values may be used depending upon implementation details. During a capture cycle, namely when scan enable 427 is held at a low logic level, counters 431 and 419 may be reset to ensure that memory writes for a next scan load/unload cycle begin from address 0. Alternatively, it should be appreciated that other configurations may be used for wrapping addresses to begin at address 0 or some other starting address.

Figure 5:
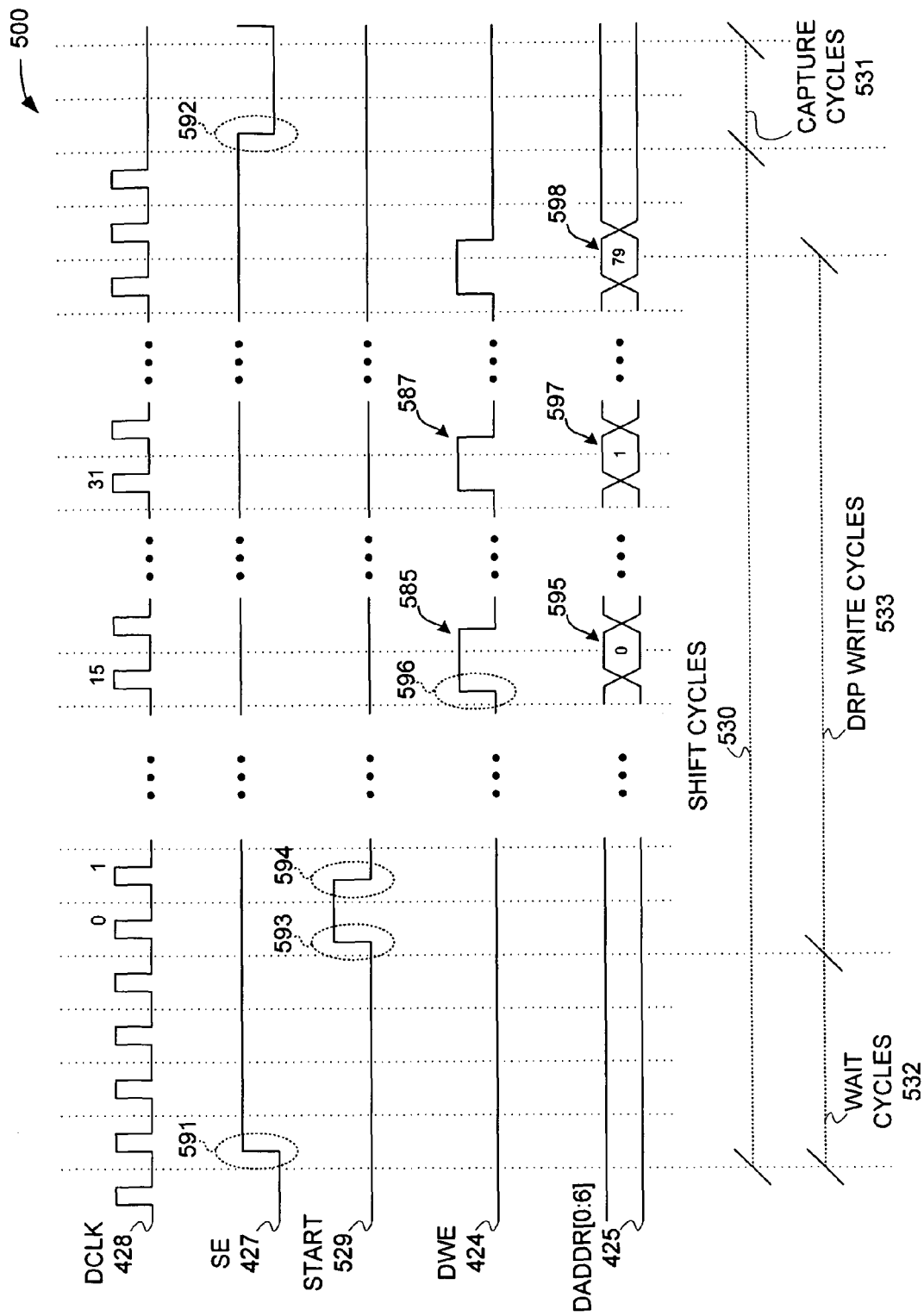
FIG. 5 is a signal diagram depicting an exemplary embodiment of signal timing of memory operations during a scan load/unload cycle.

FIG. 5 is a signal diagram depicting an exemplary embodiment of signal timing 500 for memory operations during a scan load/unload cycle. Signal timing 500 is further described with ongoing reference to FIGS. 4 and 5. Data clock signal 428 is a top level clock signal that may be used as a scan-shift clock for a configuration scan chain, such as shift register 430, during ATPG. During pattern loading, data clock signal 428 drives write controller 420 and DRP controller 408 of FIG. 4.

Data clock signal 428 may be continuously pulsed during a scan load/unload cycle as illustratively shown in part by clock pulses 0 through 31. Scan enable signal 427 is a top level signal that may be held high during a scan load/unload cycle and held low during a capture cycle. Scan enable signal 427 is transitioned from a logic low level to a logic high level generally at time 591, and held high until generally at time 592, when it is transitioned from a logic high to a logic low level generally at the start of capture cycles 531. Thus, generally holding scan enable signal 427 at a logic high level corresponds to shift cycles 530. Data clock signal 428 may be held at a logic low level during capture cycles 531.

Start signal 529 may be a numerical parameter of write controller 420 of FIG. 4 used to indicate a number of clock cycles counters 431 and 419 need to wait before starting memory writes to configuration memory cells 211. This number of cycles is generally indicated as wait cycles 532, which may generally end before time 593. Logic used to form counters 431 and 419 may be configured to prevent or suspend counting for a number of wait cycles. Accordingly, after wait cycles 532, start signal 529 may be pulsed with a rising edge generally at time 593 which may be slightly in advance of a rising edge of clock pulse 0 of data clock signal 428, and such pulse of start signal 529 may have a falling edge generally at time 594 which may be slightly after a rising edge of clock pulse 1 of data clock signal 428. If hypothetical or modeled configuration scan chain 317 of FIG. 3 is of some length Q, where Q is shorter than the longest core scan chain of embedded core 214, such as core scan chain 232 of length N, then write controller 420 may be configured to wait N-Q cycles of data clock signal 428, namely wait cycles 532 in this example, before allowing memory writes to begin. The shorter scan chain, namely modeled configuration scan chain 317 of FIG. 3, may be padded with random 0s to match the longer length of the longest embedded core scan chain, such as core scan chain 232.

Start signal 529 transitions to a logic high level generally at time 593. In this example, there are four clock pulses of data clock signal 428 after scan enable signal 427 is asserted high prior to start signal 529 being asserted high generally at time 593.

In this example, sixteen clock cycles after start signal 529 is asserted high generally at time 593, a first configuration word is loaded into shift register 430 at address 0 generally at time 595 on data address bus 425. Generally at time 596, data write enable 424 transitions from a logic low to a logic high level approximately before a rising edge of clock pulse 15 of data clock signal 428. DRP controller 408 of FIG. 4 writes such first configuration word ("word 0") at address 0 generally at time 595, as indicated on data address bus 425, responsive to pulse 585 of data write enable 424. This word 0 is written to configuration memory cells 211 of FIG. 4.

As generally indicated by pulse 587 of data write enable 424 and address 1 of data address bus 425, another word ("word 1") is written to configuration memory cells 211 at address 1 generally at time 597 responsive to clock pulse 31 of clock signal 428. This sequence repeats until address 79 on data address bus 425 generally at time 598. The above-described sequence of signals, including pulses on data write enable signal 424 and corresponding address 0 through 79 on data address bus 425, is repeated for each set of 80 test inputs. For this example such repetition does not occur until 80 address locations of configuration memory cells 211, namely 80 rows of configuration memory cells 211, have been written. Following writing to configuration memory cells 211, may be providing a test vector to embedded core 214 by a read operation and capturing the result of such testing of embedded core as generally indicated by capture cycles 531. Following capture cycles 531 may be wait ("padding") cycles 532 before starting a next sequence of DRP write cycles 533. There may be latency cycles between DRP write cycles 533 and capture cycles 531. Accordingly, by the end of a scan load/unload cycle, 80 rows of configuration memory cells 211 have been written to an ensuing capture cycle such test vector, namely 80 test inputs, is input to logic block 201 via configuration pins 212.

In the above description, shifting data serially from top level scan pins has been described. Alternatively, BRAM 106 of FIG. 1 may be used to store configuration scan data instead of shifting data serially as previously described. Using BRAM 106 saves tester memory by eliminating having to hold configuration scan pin data on tester channels. However, using BRAM 106 relies heavily on a correct initialization and working of such BRAM. It should be appreciated that even though a DRP interface, such as DRP interface 209 of FIG. 2, may include handshaking signals; such as data out and data ready, such handshaking signals need not be used as described herein. However, in alternative embodiments, one or more of such handshaking signals may be used for writing to memory to facilitate testing of some potential faults with respect to an embedded core.

With continuing reference to FIG. 5 and renewed reference to FIG. 4, it should be appreciated that shift cycles 530 include wait cycles 532 and DRP write cycles 533, as well as any latency. In this example, there are two cycles of latency between the end of DRP write cycles 533 and the beginning of capture cycles 531. Thus, shift cycles 530 include latency before the beginning of capture cycles 531, namely before initiating loading a test vector into embedded core 214. DRP write cycles 533 amount to a time span for loading an entire test vector. It should be appreciated that as each portion of a test vector is loaded into a register bank, such as into shift register 430, another portion of such test vector may be loaded into shift register 430 while writing the prior portion to configuration memory cells 211. In other words, DRP controller 408 may be configured to buffer a portion of a test vector in order to reduce latency between loading portions of such test vector to shift register 430.

Additionally, it should be appreciated that shift cycles 530 for a next test vector may commence during capture cycles 531. In other words, after an embedded core 214 receives a test vector from configuration memory cells 211, such configuration memory cells 211 may begin having another test vector written thereto, namely a read before write sequence, while embedded core 214 is processing the recently received test vector. It should be understood that responsive to a read control signal (not shown) configuration memory cells 211 may read out a test vector for configuration pins 212 coupled to logic block 201 of embedded core 214. Following such read operation, write operations for another test vector may begin while simultaneously processing a prior test vector in embedded core 214.

Figure 6:
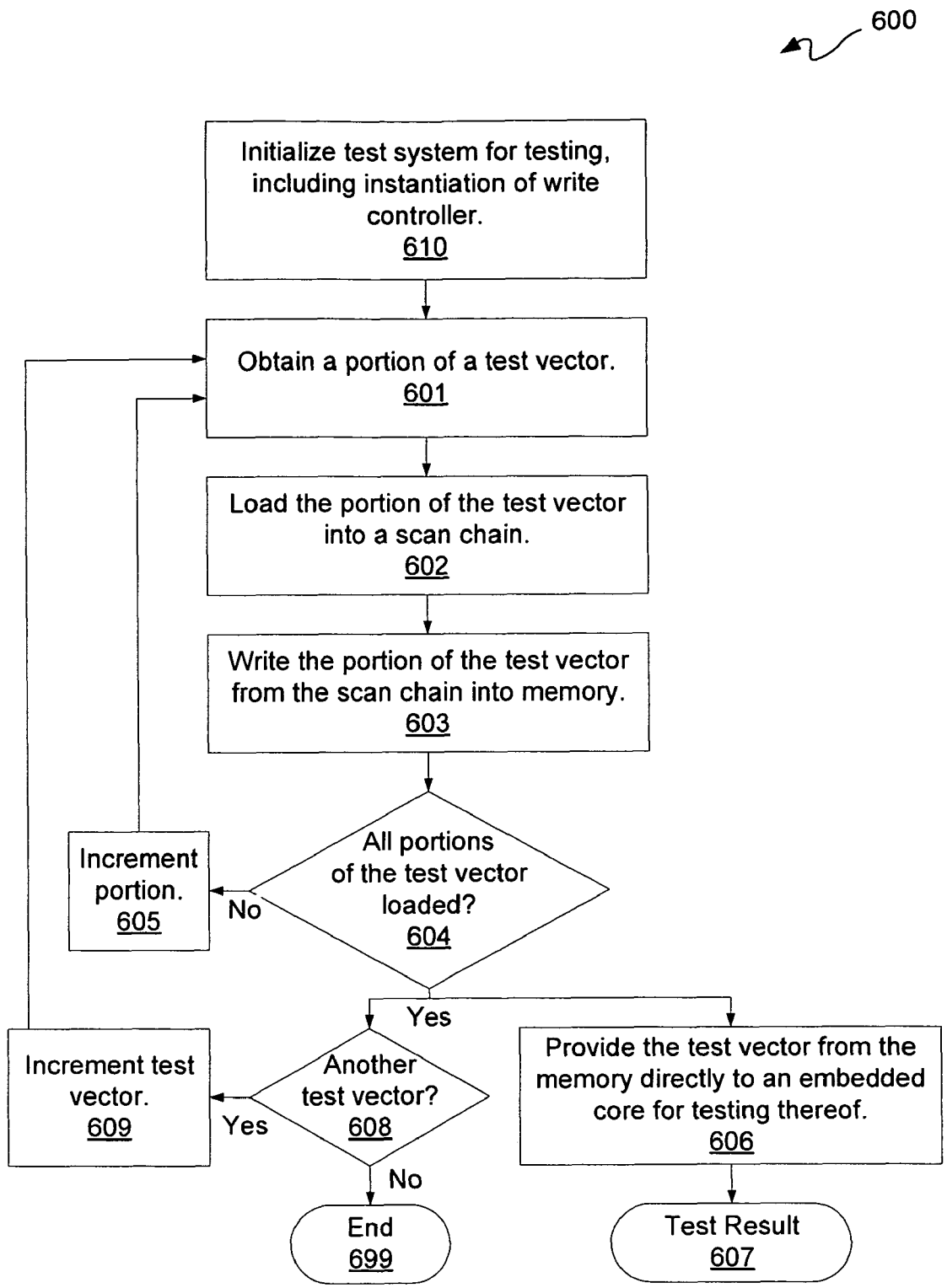
FIG. 6 is a flow diagram depicting an exemplary embodiment of an Automatic Test Pattern Generation ("ATPG") testing flow.

FIG. 6 is a flow diagram depicting an exemplary embodiment of an ATPG testing flow 600 in accordance with the above description. At 610, a test system is initialized for testing. This initialization may include instantiating write controller 420 of FIG. 4 in FPGA fabric of FPGA 100 of FIG. 1. ATPG testing flow 600 is further described with simultaneous reference to FIGS. 4 and 6.

At 601, a portion of a test vector is obtained by a write controller, such as write controller 420. At 602, the portion obtained at 601 is input to a scan chain, such as shift register 430. At 603, the portion of the test vector loaded into a scan chain at 602 may be written to a location in a memory array, such as configuration memory cells 211.

It should be appreciated that an embedded core, such as embedded core 214, may be operating while writing a portion of a test vector to a location in memory. As previously described, after a read operation, embedded core 214 may be processing another test vector. If it was not possible to write to a location in memory, such as a location in configuration memory cells 211, while embedded processor 214 was processing such test vector, then there would be a substantial amount of latency between test vector inputs to embedded core 214. Furthermore, it should be appreciated that use of DRP controller 408 of FIG. 4 allows configuration memory cells 211 to be written to without having to reset FPGA 100 of FIG. 1, such as may be the case if configuration logic 213 of FIG. 2 were used to write to configuration memory cells 211. Thus, writing to configuration memory cells 211 at 603 is dynamic with respect to embedded core 214 being in an operative or actually operating state, depending on whether test vector input is currently being processed by embedded core 214.

At 604, it is determined whether all portions of a test vector have been loaded into a memory array, such as configuration memory cells 211. If at 604 it is determined that not all portions of a test vector have been loaded, then at 605, the portion count is incremented for obtaining another portion of the test vector at 601. If, however, all portions of the test vector have been loaded as determined at 604, then at 606 the test vector stored in the memory array is read out from such memory array for providing directly, via configuration pins 212, to logic block 201 of embedded core 214. Thus, testing of what would otherwise be a substantially inaccessible logic block for purposes of scan chain testing becomes possible without having to add substantial circuitry overhead to FPGA 100. Responsive to such test vector input to such embedded core, such embedded core is tested and test results 607 from such testing may be obtained from such embedded core, such as via I/Os 205 or via SO 207-0 of FIG. 2.

Simultaneously with providing a test vector directly to an embedded core at 606, it may be determined at 608 whether another test vector is to be loaded. Thus, again it should be appreciated that while a test vector is being processed by an embedded core another test vector may be loaded into configuration memory cells 211 via write controller 420 for this dynamic operative processing. If at 608 it is determined that another test vector does not need to be loaded, flow 600 may end at 699 subject to completion of any processing of a test vector by an embedded core at 606. If, however, another test vector is to be loaded as determined at 608, then at 609 the test vector count may be incremented for obtaining an initial portion of another test vector at 601. It should be appreciated that the obtaining of portions of test vectors at 601 may be from a database as associated with a test bench, as described below in additional detail.

Figure 7:
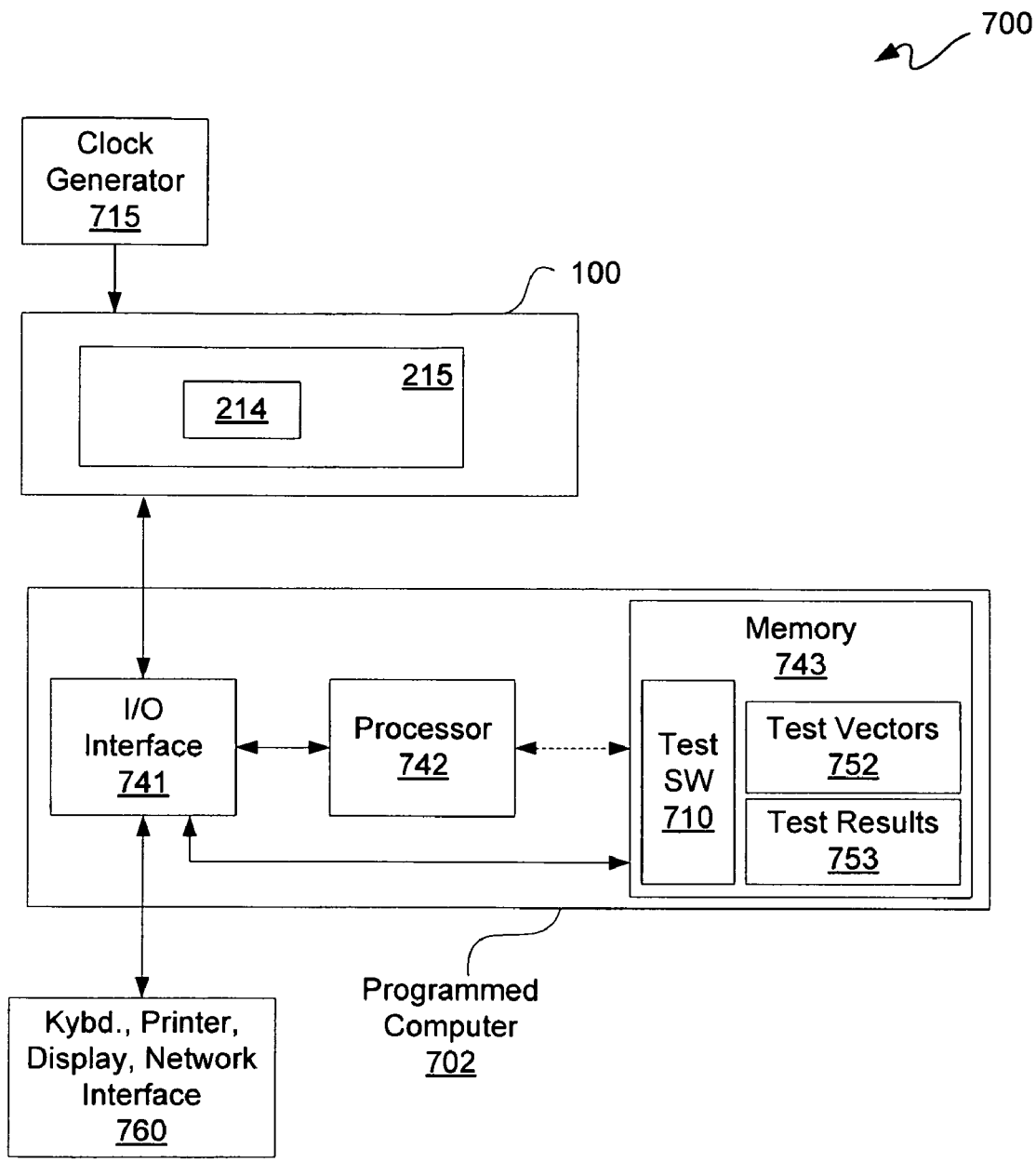
FIG. 7 is a block diagram depicting an exemplary embodiment of a test system.

FIG. 7 is a block diagram depicting an exemplary embodiment of a test system 700. Test system 700 includes a programmed computer ("test bench") 702, FPGA 100 of FIGS. 1 and 2, and a free running clock source, namely off-chip programmable clock generator 715. As described above with reference to FIG. 2, FPGA 100 includes a system block 215 with an embedded core 214 which includes a "circuit-under-test," namely logic block 201.

Programmed computer 702 may be coupled to devices 760, such as a keyboard, a touch pad, a cursor pointing device, a printer, and a display device, as well as other known input, output, and input/output devices, including a computer network interface. Programmed computer 702 comprises I/O interface 741 coupled to processor 742 and to memory 743. Memory 743 may additionally or alternatively be directly coupled to processor 742.

Programmed computer 702 is programmed with an operating system, such as OS from Apple, Java, Linux, Solaris, UNIX, Windows, and Vista and Windows2000, among other known platforms. At least a portion of an operating system may be disposed in memory 743. Memory 743 may include one or more of the following: random access memory, read only memory, magneto-resistive read/write memory, optical read/write memory, cache memory, magnetic read/write memory, and the like, as well as other signal-bearing media as set forth below. Other signal-bearing media include: non-writable storage media (e.g., read-only memory devices within a computer such as CD-ROM or DVD-RAM disks readable by a CD-ROM drive or a DVD drive); and writable storage media (e.g., floppy disks within a diskette drive or hard-disk drive or read/writable CD or read/writable DVD), among others.

Memory 743 of programmed computer 702 may include test software ("test SW") 710 for testing embedded core 214. Test vectors 752 may be generated by such test software 710, where test software 710 includes ATPG for example. Additionally, such test vectors 752 may be buffered in memory 743 for providing to FPGA 100. Test results 753, obtained responsive to testing with test vectors 752, may be stored in memory 743. It should be appreciated that by using a write controller, such as write controller 420 of FIG. 4, test software 710 may be a test bench using Xilinx ISE.

With renewed reference to FIGS. 2, 4, and 5 as well as ongoing reference to FIG. 7, I/O interface 741 may be coupled to I/Os 205, SIs 206, SOs 207, SE 491 of FPGA 100. Because write controller 420 is instantiated in FPGA fabric of FPGA 100, it should be appreciated that generally accessible SIs 206 and SOs 207, as well as SE 491, may be coupled via IOBs. Alternatively, JTAG pins may be used. Clock generator 715 may be used for providing data clock signal 428 to FPGA 100.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for testing an integrated circuit having a hard-wired embedded core and memory, the memory being coupled to the embedded core in the integrated circuit, the method comprising:
   writing a test vector to the memory while the embedded core is operative;
   inputting the test vector from the memory to the embedded core to mimic scan chain input to the embedded core;
   obtaining a test result from the embedded core responsive in part to the test vector input;
   loading a portion of the test vector into a shift register of a first controller;
   outputting the portion of the test vector from the shift register into a second controller for subsequent writing to the memory; and
   wherein the writing of the portion of the test vector is from the second controller to the memory.

2. The method according to claim 1, wherein
   the second controller is a dynamic reconfiguration port controller; and
   the memory is an array of configuration memory cells.

3. The method according to claim 2, further comprising:
   programming programmable logic to instantiate the first controller in the programmable logic to provide an instantiated-in write controller.

4. The method according to claim 3, wherein the first controller is for the testing using test patterns generated by automatic test pattern generation.

5. The method according to claim 2, wherein:
   the portion of the test vector is written to a row of the array of configuration memory cells; and
   repeating the writing, the inputting, the loading, and the outputting, respectively, for successive portions of the test vector following the portion of the test vector.

6. The method according to claim 2, wherein the shift register is implemented as a serial-to-parallel shift register.

7. A system for testing an embedded core coupled to an array of memory cells within a host integrated circuit, comprising:
   a programmed computer;
   the programmed computer programmed with a testing software program;
   a device under test coupled to the programmed computer for receiving test vectors therefrom and for providing test results thereto responsive to the test vectors;
   the device under test including:
   a write controller for respectively receiving portions of the test vectors and configured to convert each portion of the portions from serial to parallel to output parallel data;
   the write controller configured to generate control information and address information;
   a memory controller coupled to the write controller for receiving the address information, the control information, and the parallel data therefrom;
   the array of memory cells coupled to the memory controller, the memory controller for selectively writing the parallel data to locations in the array of memory cells;
   the embedded core coupled to the array of memory cells, wherein operation of the embedded core is dynamically alterable responsive to the parallel data input from the array of memory cells; and the write controller, the memory controller, and the array of memory cells configured to mimic scan chain input with respect to the testing software program for testing the embedded core.

8. The system according to claim 7, wherein the testing software program is configured to generate test patterns using automatic test pattern generation.

9. The system according to claim 8, wherein:
the testing software program is not configured for performing sequential memory writes;
the testing software program provides each of the portions of the test vectors to the write controller as though loading a test vector into a register bank; and
the write controller is configured to perform computations for the sequential memory writes to the memory cells for respective input of the test vectors.

10. The system according to claim 9, wherein:
the write controller includes a serial-to-parallel shift register, a first counter, and a second counter;
the serial-to-parallel shift register coupled to sequentially receive each of the portions of the test vector as a series of bits and configured to output the series of bits as the parallel data to the memory controller;
the first counter configured to indicate when to write the parallel data to the array of memory cells; and
the second counter configured to provide an address for writing the parallel data and configured to increment the address for each successive write of the parallel data for a succession of the portions of the test vectors.

11. The system according to claim 10, wherein the first counter and the second counter are configured to be reset responsive to completely writing all the portions of the test vector into the array of memory cells.

12. The system according to claim 11, wherein:
the memory controller is a dynamic reconfiguration port controller; and
the array of memory cells is an array of configuration memory cells.

13. The system according to claim 12, wherein the host integrated circuit device is a programmable logic device.

14. The system according to claim 13, wherein the embedded core is a microprocessor core.

15. A host integrated circuit having an embedded core and memory, the host integrated circuit comprising:
a write controller for respectively receiving portions of test vectors;
a memory controller coupled to the write controller for receiving address information, control information, and data from the write controller;
the memory coupled to the memory controller for selectively writing the data thereto;
the embedded core coupled to the memory, wherein operation of the embedded core and the memory is configured for dynamically writing to the memory while operating the embedded core; and
the write controller, the memory controller, and the memory configured to mimic scan chain input with respect to a testing software program for testing the embedded core.

16. The host integrated circuit according to claim 15, wherein the testing software program is configured for generation of test patterns using automatic test pattern generation.

17. The host integrated circuit according to claim 16, wherein:
the testing software program is not configured for performing sequential memory writes;
the testing software program provides each portion of the portions of the test vectors to the write controller as though providing to a shift register; and
the write controller is configured to perform computations for the sequential memory writes to memory.

18. The host integrated circuit according to claim 17, wherein:
the write controller includes a serial-to-parallel shift register, a first counter, and a second counter;
the serial-to-parallel shift register coupled to sequentially receive each of the portions of each test vector of the test vectors as a series of bits and configured to output the series of bits as the data in parallel to the memory controller;
the first counter configured to indicate when to write the data to the memory; and
the second counter configured to provide an address for writing the data to the memory and configured to increment the address for each successive write of the data for a succession of the portions of the test vectors.

19. The host integrated circuit according to claim 18, wherein the host integrated circuit is a programmable logic device.

* * * * *